United States Patent
Greer et al.

(10) Patent No.: US 9,425,376 B2
(45) Date of Patent: *Aug. 23, 2016

(54) PLASMA CLEANING OF SUPERCONDUCTING LAYERS

(71) Applicant: Intermolecular Inc., San Jose, CA (US)

(72) Inventors: Frank Greer, Pasadena, CA (US); Andy Steinbach, San Jose, CA (US)

(73) Assignee: Intermolecular, Inc., San Jose, CA (US)

(*) Notice: Subject to any disclaimer, the term of this patent is extended or adjusted under 35 U.S.C. 154(b) by 276 days.

This patent is subject to a terminal disclaimer.

(21) Appl. No.: 14/138,672

(22) Filed: Dec. 23, 2013

(65) Prior Publication Data

US 2015/0179918 A1 Jun. 25, 2015

(51) Int. Cl.
*H01L 39/24* (2006.01)

(52) U.S. Cl.
CPC ................ *H01L 39/2493* (2013.01)

(58) Field of Classification Search
CPC .................................. H01L 39/2493
See application file for complete search history.

(56) References Cited

U.S. PATENT DOCUMENTS

| 5,399,881 A | 3/1995 | Bozovic |
| 7,449,345 B2 | 11/2008 | Horng |
| 7,598,579 B2 | 10/2009 | Horng |
| 8,119,424 B2 | 2/2012 | Mather |
| 2013/0001668 A1 | 1/2013 | Frank |

OTHER PUBLICATIONS

Mikko Ritala et al; Atomic Layer Deposition of Oxide Thin Films with Metal Alkoxides as Oxygen Sources; May 9, 2013; Science AAAS.

*Primary Examiner* — Colleen Dunn

(57) ABSTRACT

In a "window-junction" formation process for Josephson junction fabrication, a spacer dielectric is formed over the first superconducting electrode layer, then an opening (the "window" is formed to expose the part of the electrode layer to be used for the junction. In an atomic layer deposition (ALD) chamber (or multi-chamber sealed system) equipped with direct or remote plasma capability, the exposed part of the electrode is sputter-etched with Ar, $H_2$, or a combination to remove native oxides, etch residues, and other contaminants. Optionally, an $O_2$ or $O_3$ pre-clean may precede the sputter etch. When the electrode is clean, the tunnel barrier layer is deposited by ALD in-situ without further oxidant exposure.

20 Claims, 5 Drawing Sheets

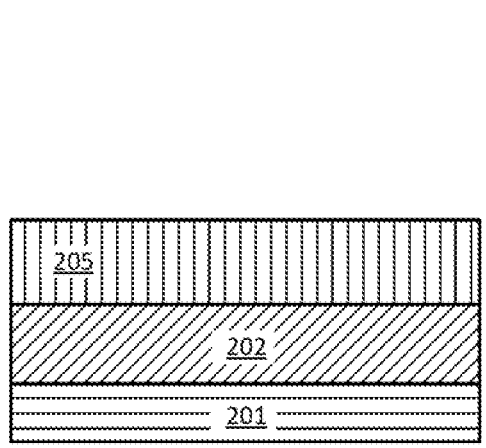
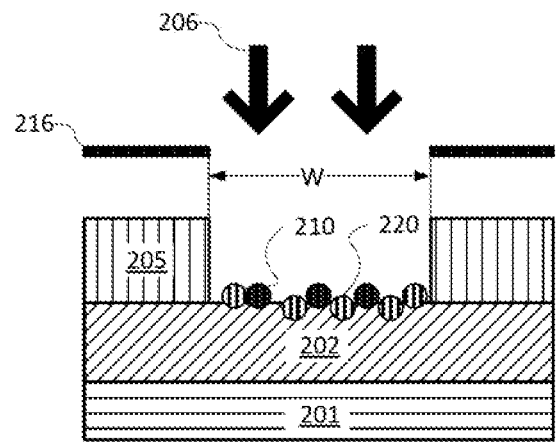
FIG. 2A          FIG. 2B
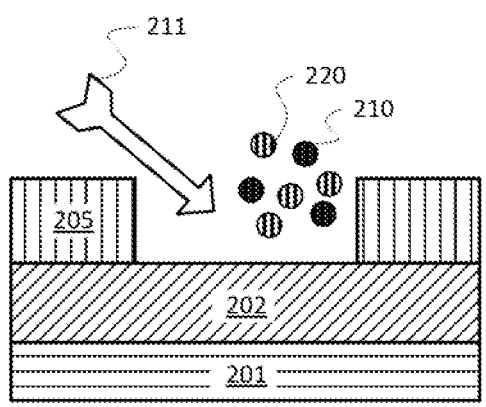
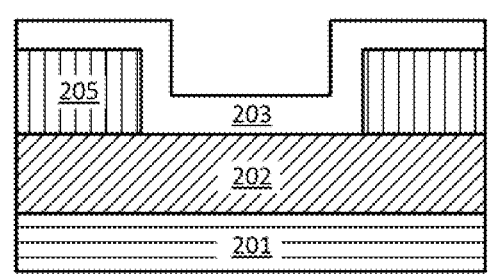
FIG. 2C          FIG. 2D
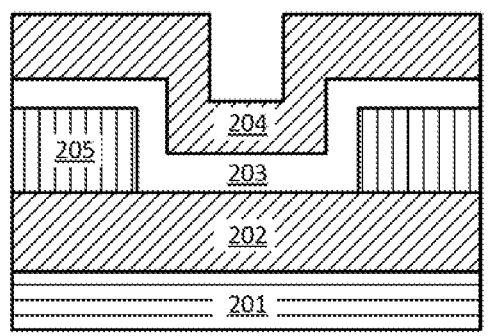
FIG. 2E

PLASMA CLEANING OF SUPERCONDUCTING LAYERS

BACKGROUND

Related fields include superconducting electronics, particularly Josephson junctions, and plasma cleaning processes.

Superconductivity—zero resistance to direct electrical current and expulsion of magnetic fields—results from a phase transition that occurs in some materials at temperatures lower than a critical temperature. For many metals and alloys, the critical temperature is less than 20 degrees Kelvin; for some materials (e.g., high-temperature superconducting ceramics) the critical temperature is higher.

In a superconducting material, the electrons become paired ("Cooper pairs"), attracted very slightly to each other as a result of interactions with a surrounding ionic lattice that is distorted in proximity to the electrons. When paired, the electrons' energy state is lowered, forming a small (0.002 eV) energy gap around the Fermi level. The gap inhibits the electron/lattice collisions that manifest as normal electrical resistance, so that the electrons move through the ionic lattice without being scattered.

A Josephson junction is a thin layer of a non-superconducting material between two superconducting layers. Pairs of superconducting electrons can tunnel through the thin non-superconducting layer ("tunnel barrier") from one of the adjacent superconductors to the other. Types of Josephson junctions include S-I-S (superconductor, insulator, superconductor; also known as a superconducting tunnel junction, "STJ"), S-N-S (superconductor, non-superconducting metal, superconductor), or S-s-S (all-superconductor, with a superconductivity-weakening physical constriction in the middle section).

When a current is applied to a Josephson junction, the voltage across it is either zero (if the current I is below a critical current $I_c$) or an AC voltage, typically near ~500 GHz/mV (if $I \geq I_c$). If a DC voltage is applied across a Josephson junction, the current oscillates with a frequency proportional to the voltage: $f=(2e/h)V$, where f is the frequency, e is the electron charge, h is Planck's constant, and V is the applied voltage,). If a Josephson junction is irradiated with electromagnetic radiation of frequency $f_a$, (e.g., a microwave frequency), the Cooper pairs synchronize with $f_a$ and its harmonics, producing a DC voltage across the junction.

STJs can be used as elements of quantum logic, rapid single flux quantum circuits, and single-electron transistors; as heterodyne mixers and superconducting switches such as quiterons; as magnetometers, e.g. superconducting quantum interference devices (SQUIDs); and as other sensors such as voltmeters, charge sensors, thermometers, bolometers and photon detectors. However, mass production of STJ-based devices has been challenging, in part because critical current and critical current density tends to vary among STJs formed on different parts of a substrate.

Cooper pairs merge into a condensate in velocity space, also called a collective quantum wave. If the insulator in an STJ is sufficiently thin, the wave can "spill out" of the superconductor and the electron pair can tunnel through the insulator, but excess thickness can prevent an STJ from functioning. Control of the thickness of the tunnel barrier is thus critical to STJ performance; it generally needs to be about 3 nm or less, and in some cases between 0.07 and 1.5 nm.

In addition, Cooper pairing is easily disrupted by defects such as grain boundaries and cracks, which can create Josephson weak links ("accidental" Josephson junctions). In a superconducting microwave circuit, the weak links cause nonlinearity in resistance and reactance, intermodulation of different microwave tones, and generation of unwanted harmonics. Control of defects, both in bulk materials and at interfaces, is therefore also critical.

Unwanted oxidation of the superconducting electrodes has been identified as a source of excess tunnel-barrier thickness (because the extra oxide adds to the intentionally formed tunnel barrier), defects, and non-uniformity of critical current and critical current density in STJs. In fabrication methods that etch an overlayer to expose the electrode before depositing the tunnel barrier, etch residues and other contaminants or by-products can also create interface defects. Therefore, a need exists for fabrication methods that eliminate the contaminants and prevent or remove the unwanted electrode oxidation.

SUMMARY

The following summary presents some concepts in a simplified form as an introduction to the detailed description that follows. It does not necessarily identify key or critical elements and is not intended to reflect a scope of invention.

Some embodiments of a method for window-junction STJ fabrication include plasma cleaning of the exposed part of the lower superconducting layer (bottom electrode) followed by in-situ formation of the tunnel barrier layer by atomic layer deposition (ALD).

Some embodiments make use of an ALD chamber having (direct or remote) plasma capability or a multi-chamber apparatus sharing a controlled environment. Immediately before ALD of the tunnel barrier, the exposed superconducting layer is sputter-etched with Ar, $H_2$, or a combination. Optionally, an $O_2$ or $O_3$ pre-clean can precede the sputter etch. Then, with no vacuum break or further oxygen exposure, the tunnel barrier is formed by ALD.

BRIEF DESCRIPTION OF DRAWINGS

The accompanying drawings may illustrate examples of concepts, embodiments, or results. They do not define or limit the scope of invention. They are not drawn to any absolute or relative scale. In some cases, identical or similar reference numbers may be used for identical or similar features in multiple drawings.

FIGS. 2A-2E schematically illustrate window-junction fabrication with plasma cleaning followed by in-situ tunnel barrier formation.

DETAILED DESCRIPTION OF EXAMPLE EMBODIMENTS

Figure 1A:
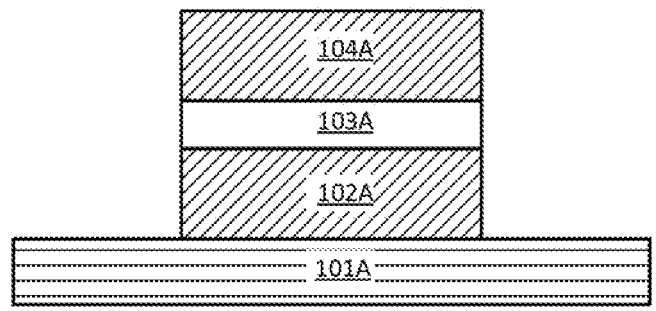
FIGS. 1A-1B conceptually illustrate some configurations of layers of an STJ.

A detailed description of one or more example embodiments is provided below. To avoid unnecessarily obscuring the description, some technical material known in the related fields is not described in detail. Semiconductor fabrication generally requires many other processes before and after those described; this description omits steps that are irrelevant to, or that may be performed independently of, the described processes.

Unless the text or context clearly dictates otherwise: (1) By default, singular articles "a," "an," and "the" (or the absence of an article) may encompass plural variations; for example, "a layer" may mean "one or more layers." (2) "Or" in a list of multiple items means that any, all, or any combination of less than all the items in the list may be used in the invention. (3) Where a range of values is provided, each intervening value is encompassed within the invention. (4) "About" or "approximately" contemplates up to 10% variation. "Substantially" contemplates up to 5% variation.

"Above," "below," "bottom," "top," "side" (e.g. sidewall), "higher," "lower," "upper," "over," and "under" are defined with respect to the horizontal plane. "On" indicates direct contact; "above" and "over" allow for intervening elements. "On" and "over" include conformal configurations covering feature walls oriented in any direction.

"Film" and "layer" are synonyms representing a portion of a stack, and may mean either a single layer or a portion of a stack with multiple sub-layers (e.g., a nanolaminate). "Substrate," as used herein, may mean any workpiece on which formation or treatment of material layers is desired. Substrates may include, without limitation, silicon, germanium, silica, sapphire, zinc oxide, SiC, AlN, GaN, Spinel, coated silicon, silicon on oxide, silicon carbide on oxide, glass, gallium nitride, indium nitride and aluminum nitride, and combinations (or alloys) thereof. The term "substrate" or "wafer" may be used interchangeably herein. Semiconductor wafer shapes and sizes can vary and include commonly used round wafers of 50 mm, 100 mm, 150 mm, 200 mm, 300 mm, or 450 mm in diameter.

The term "remote plasma source" as used herein refers to a plasma (e.g., an rf or microwave generated plasma) located at a distance from a deposition or treatment location sufficient to allow some filtering of the plasma components. For example, the density of ions and electrons can be adjusted by distance, and electrons and ions can also be filtered out using suitable electrode configurations, such as a grounded metal showerhead so that only atomic or molecular radicals reach the substrate. "In situ" is used herein to mean "without an intervening vacuum break or other exposure to an uncontrolled environment." This includes "in the same process chamber" as a previous or subsequent process, and also includes "in another chamber with vacuum access to" the chamber used for the previous or subsequent process (for example, in a multi-chamber cluster tool). As used herein, "controlled atmosphere" and "controlled environment" are equivalent and refer to a vacuum or inert-gas environment. Examples of inert gases include noble gases (helium, neon, argon, krypton, xenon) and, unless the text or context excludes it (e.g., by describing nitride formation as undesirable), nitrogen.

Material descriptions such as "conductor," "superconductor," "semiconductor," "dielectric," and "insulator" may vary with temperature for a given material, and shall be used herein to describe the characteristics of the materials at the intended operating temperature of the device in which the materials are used. For example, "forming a superconducting layer" shall mean "forming a layer of a material expected to exhibit superconductivity at the intended operating temperature of the device being fabricated."

Figure 1B:
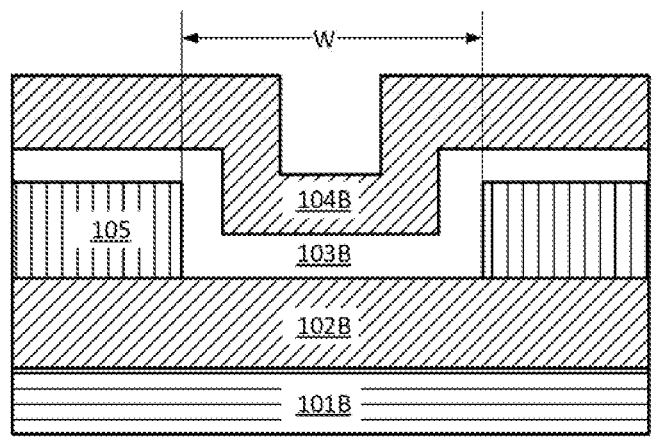

FIGS. 1A-1B conceptually illustrate some configurations of layers of an STJ. Each of the substrates 101A and 101B may include underlying layers and structures. In FIG. 1A, the STJ is formed by the "tri-layer" method. A first superconducting electrode layer 102A, a tunnel barrier layer 103A, and a second superconducting electrode layer 104A form a pillar. The pillar may be formed, for example, by depositing blanket layers of the STJ materials (materials are discussed in detail near the end of this Description) and patterning (e.g., etching) them into one or more pillar shapes.

In FIG. 1B, the STJ is formed by the "window-junction" method. A spacer dielectric 105 separates first superconducting electrode layer 102B from tunnel barrier layer 103B except within an opening (the "window" of width W), that is etched or otherwise formed in spacer dielectric 105. Tunnel barrier layer 103B is formed to contact first superconducting electrode layer 102B within the window; then a second superconducting electrode layer 104B is formed over tunnel barrier layer 103B. Sidewall coverage within the window may not be critical because the spacer dielectric 105 outside the tunnel barrier sidewalls is not likely to be a source or sink of leakage current.

Compared to the tri-layer approach, the window-junction approach is self-aligning, and also less prone to shorts because conductive contaminants have no opportunity to form unwanted leakage paths between the electrodes down the sidewalls of the tunnel barrier. However, there are other challenges. Parasitic oxidation can occur in window-junction fabrication while the electrode surface is exposed after window formation and before formation of the tunnel barrier. Any exposure to air or to a source of oxygen can cause an oxide to form on the electrode surface. A vacuum break between cleaning the electrode surface and depositing the tunnel barrier can provide an opportunity for oxidation. Etch residues may also be trapped on the electrode surface after the window formation. These residues can become interfacial defects after being covered with the tunnel barrier material.

FIGS. 2A-2E schematically illustrate window-junction fabrication with plasma cleaning followed by in-situ tunnel barrier formation. In FIG. 2A, spacer dielectric 205 is formed on first superconducting layer (bottom electrode) 202 on substrate 201. Substrate 201 may include other layers or structures, such as interconnects or other device layers, under first superconducting layer 202. Superconducting layer 202 may be about 50-200 nm thick and made of any superconducting material, such as aluminum (Al), niobium (Nb), tantalum (Ta), titanium (Ti), their nitrides, their alloys, or ceramic or organic superconductors. Superconducting layer 202 may be patterned before forming spacer dielectric 205. Spacer dielectric 205 may be about 100-250 nm thick and can include a silicon oxide such as $SiO_2$, or any other material that is insulating at the intended operating temperature of the STJ.

In FIG. 2B, patterning agent 206 (e.g., a dry or wet etchant) creates the "window," an opening of width W through spacer dielectric 205 to expose part of the superconducting electrode 202. The width W may be less than 1000 nm (e.g., 10-200 nm) and constrained by, for example, an aperture in a mask 216. Mask 216 may be above the top surface of spacer dielectric 205, as illustrated, or may be in contact with spacer dielectric 205. The process may leave behind etch residues 210. Either the process or a subsequent vacuum break or other oxygen exposure may form native oxide 220 on the exposed part of electrode 202.

In FIG. 2C, cleaning agent 211 removes etch residues 210 and native oxide 220. This is done in the same chamber, or in the same multi-chamber tool with a shared controlled environment, where the tunnel junction layer will be formed. A single-step plasma clean, such as sputtering with Ar, $H_2$, or a combination of both, may remove all the contaminants. Alternatively, a pre-treatment with $O_2$ or $O_3$ species may initially remove some contaminants, such as etch residues 210, then the remaining contaminants and native oxide 220 (including native oxide formed by the oxygen-containing pre-treatment) may be removed by sputtering with Ar, $H_2$, or Ar+$H_2$. The reactive species may be generated by a direct plasma at the substrate or a remote plasma with a feed-through to the chamber.

In FIG. 2D, tunnel barrier layer 203 is formed over spacer dielectric 203 to contact the exposed, cleaned part of first superconducting layer 202 inside the window. Tunnel barrier layer 203 is formed by in-situ ALD, in the same controlled environment in which the plasma cleaning was performed. Thus no additional native oxide forms on superconducting layer 202 before the ALD begins. Tunnel barrier layer 203 may be 0.5-3 nm thick and made of a dielectric such as silicon oxide, aluminum oxide, germanium oxide, hafnium oxide, niobium oxide, tantalum oxide, titanium oxide, zirconium oxide, an oxide of two or more of these materials, or any other suitable dielectric. Tunnel barrier layer 203 may, or may not, share a metal with the first superconducting layer 202. Alternatively, tunnel barrier 203 may be a different non-superconducting material such as a non-superconducting metal (e.g., copper, silver, or gold).

In FIG. 2E, second superconducting layer (top electrode) 204 is formed over tunnel barrier layer 203. Any of the materials or formation methods used for first superconducting layer 202 may be used for second superconducting layer 204. Second superconducting layer 204 may be patterned once it is formed. Second superconducting layer 204 layer may, or may not, share a metal with tunnel barrier layer 203.

Figure 3:
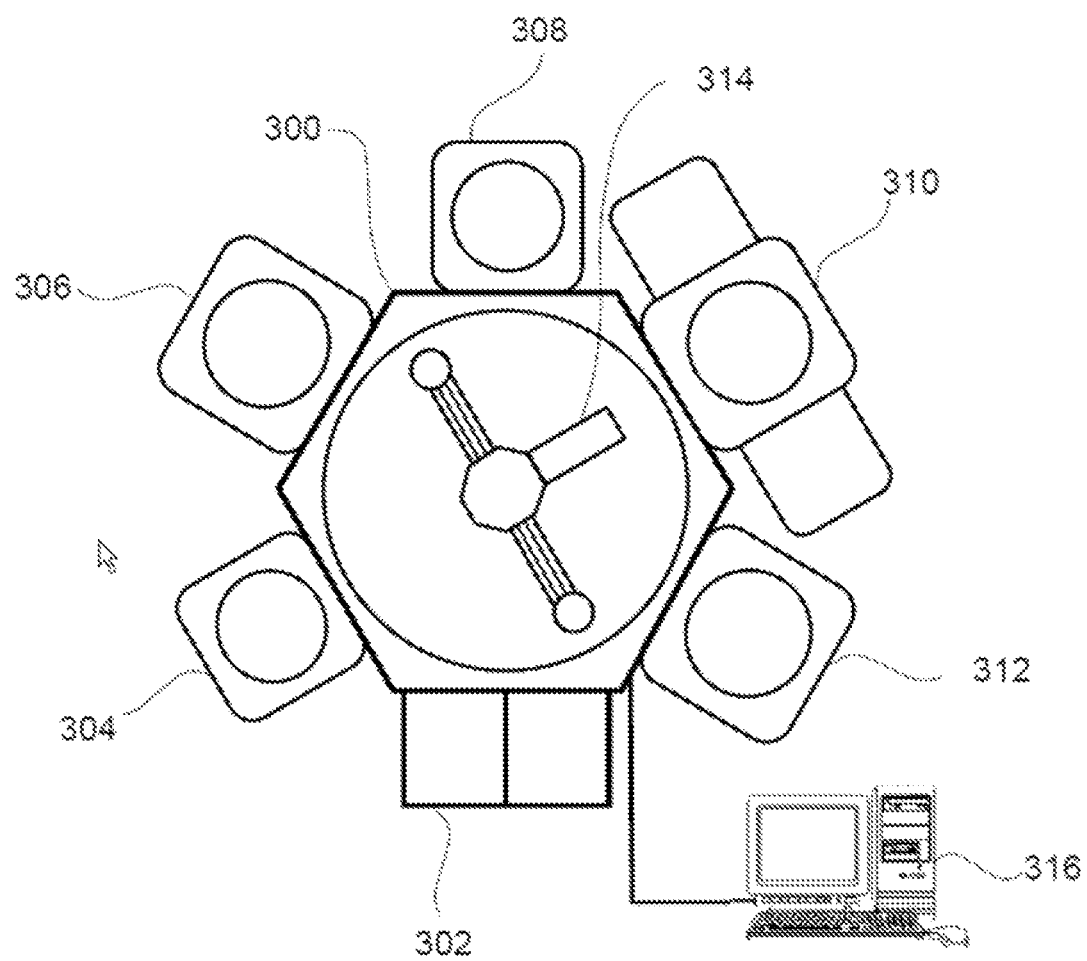
FIG. 3 is a simplified schematic diagram of an example of a multi-chamber processing system with a shared controlled environment.

FIG. 3 is a simplified schematic diagram of an example of a multi-chamber processing system with a shared controlled environment. A frame 300 supports multiple processing modules. Frame 300 may be a unitary frame enclosing a controlled environment, such that substrates may be transferred between modules within the frame without exposure to ambient air or any other uncontrolled or unwanted ambient. Load lock/factory interface 302 provides access into the plurality of modules. Robot 314 provides for the movement of substrates (and masks) between the modules and into and out of load lock 302. Modules 304-312 may be any set of modules. For example, module 304 may be an orientation/degassing module, module 306 may be a plasma cleaning module, module 308 may be an ALD module and module 310 may be a PVD module. In some embodiments, a centralized controller, i.e., computing device 316, may control the processes, including the power supplies, substrate handling, plasma generating sources, liquid or gas inlets and exhausts, temperature controllers, and the like.

Figure 4A:
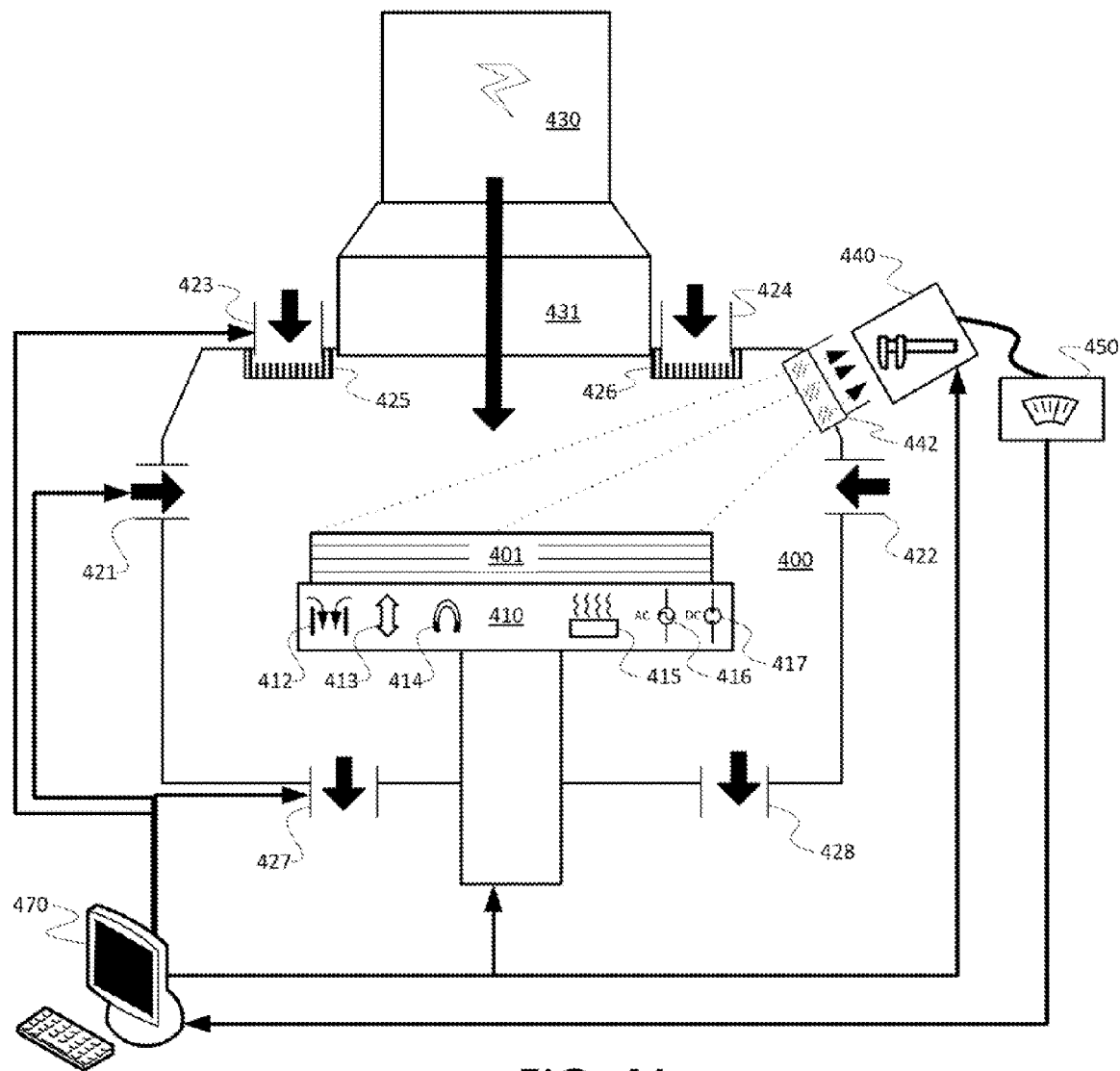
FIGS. 4A and 4B are block diagrams of example plasma-equipped ALD apparatus.
Figure 4B:
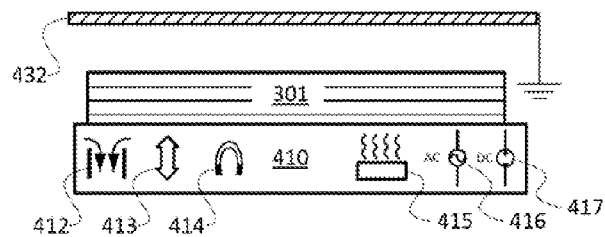

FIGS. 4A and 4B are block diagrams of example plasma-equipped ALD apparatus. Inside ALD chamber 400, substrate 401 is held by a substrate holder 410. Substrate holder 410 may be configured with vacuum 412 (for example, a vacuum chuck to grip the substrate); motion 413 in any direction, which may include tilt and rotation; a magnetic field source 414; heater or temperature control 415; or sources of AC 416 or DC 417 bias voltage, or static electrical charge for an electrostatic chuck to hold the substrate (not shown). Chamber 400 also has gas inlets 421, 422, 423, 424 for precursors, buffer gases, and purge gases. Some of the inlets may feed through diffusers 425, 426. Measurement system 440 may monitor substrate 401 through measurement ports 442. The measurements from measurement system 440 may be collected by a monitoring system 450 and sent for analysis or storage to a data collection device such as computer 470. Substrate holder 410, gas inlets 421-324, diffusers 425-26, remote plasma chamber 430, plasma input adapter 431, exhausts 427-28, measurement system 440, and monitoring system 450 may jointly or individually be controlled by controllers such as computer 470.

To form ALD layers (such as high-k or low-k metal oxides or metal nitrides), the substrate 401 is prepared and positioned on substrate holder 410. Preparing substrate 401 may include removing pre-existing native oxides from a top semiconductor surface by any suitable method. Substrate 401 may be held on substrate holder 410 electrostatically, by vacuum, or by any other suitable means. Precursors for making the layers, as well as other process gases or species such as buffers or catalysts, may enter through plasma input adapter 431, undiffused gas inlets 421 and 422, or gas inlets 423 and 424 with diffusers 425 and 426. Precursors may be introduced into chamber 400 in "pulses," short periods of inflow followed by a delay to allow a portion of the precursor to adsorb on the surface of substrate 401, or the inflow may be continuous. To promote or regulate the adsorption of the deposited material from the precursors, substrate 401 may be heated or cooled 415, AC- or DC-biased 416 or 417, or subjected to a magnetic field 414 by substrate holder 410.

Exhausts 427 and 428 may equalize the pressure for continuously flowing precursors. Measurement equipment 440 may dynamically measure characteristics of the surface of substrate 401 so that monitoring equipment 450 may track the progress of precursor deposition. After each pulse or period of precursor inflow, chamber 400 may be purged by drawing any gaseous contents out through exhausts 427 and 428. In some embodiments, a purge gas may be routed through chamber 400. Purge gases are often inert gases such as nitrogen and argon, but other types of purge gases are sometimes used. The temperature, electric field, or magnetic field of substrate 401 may also be adjusted during the purge.

The chamber in FIG. 4A has a remote plasma chamber 430, which may generate reactive species that enter chamber 400 through input adapter 431. FIG. 4B shows an alternative configuration for generating a direct plasma at substrate 401. An electrode 432 may be provided above and parallel to substrate holder 410. As illustrated, electrode 432 is grounded and the AC bias 416 or DC bias 417 of substrate holder 410 may create the electric field around substrate 401; alternatively, substrate holder 410 may be grounded and electrode 432 may be biased.

Figure 5:
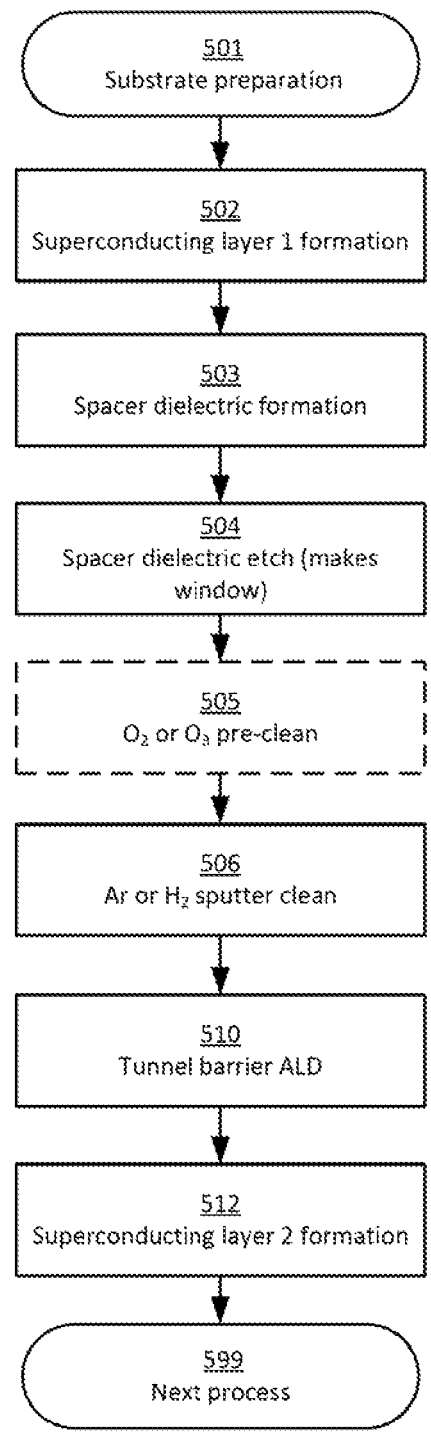
FIG. 5 is a process flowchart for forming a Josephson junction by the window-junction method with electrode plasma cleaning followed by in-situ tunnel barrier ALD.

FIG. 5 is a process flowchart for forming a Josephson junction by the window-junction method with electrode plasma cleaning followed by in-situ tunnel barrier ALD. Substrate preparation 501 may include cleaning, degassing, and/or formation of underlying interconnects and other layers or structures. Formation 502 of the first superconducting electrode layer may be done by ALD, electrochemical deposition, chemical vapor deposition (CVD), physical vapor deposition (PVD), plasma-enhanced variations, or any other suitable method, depending on the materials and dimensions required. In some embodiments, formation 502 may include patterning.

Spacer dielectric formation 503 may be done by a vacuum-based or "dry" process such as PVD, ALD, PE-ALD, AVD, UV-ALD, CVD, PECVD, or evaporation. Alternatively, it may be deposited by a solution-based or "wet"

process such as printing or spraying of inks, screen printing, inkjet printing, slot die coating, gravure printing, wet chemical depositions, or from sol-gel methods, such as the coating, drying, and firing of polysilazanes. Spacer dielectric patterning 504 forms the window that exposes part of the first superconducting electrode layer, and may be done by any suitable dry or wet etching method known in the art.

Optionally, an oxygen or ozone plasma pre-cleaning 505 may be performed; for example, if there are etch residues or other contaminants that are most effectively removed by oxidants. Sputter cleaning 506 with argon, hydrogen, or a combination removes unwanted oxides, including those created by the oxidant cleaning 505. For example, during the substrate pre-cleaning the plasma power may be 50-500 W, the substrate temperature may be between about 25 C and 400 C, the chamber pressure may be between 0.1 and 5 Torr, and the flow rate of the active species may be 0.01-1000 sccm. A purge of the chamber may be included as a final step of cleaning 506. In some embodiments, the substrate is not exposed to an uncontrolled ambient atmosphere between cleaning 505 and tunnel barrier ALD 510. For example, the two treatments may be done in suitably equipped chambers sharing a controlled environment, or in the same chamber.

The tunnel barrier ALD 510 includes one or more cycles. Each cycle may include a pulse of a first precursor, a first purge, a pulse of a second precursor, and a second purge 506.4. The cycles continue until the tunnel barrier reaches a desired thickness (e.g., 0.5-3 nm). Optionally, a post-treatment such as annealing, plasma densification, or UV irradiation may follow the tunnel barrier ALD 510.

Second superconducting electrode layer 512 may include methods and materials similar to those used for the first superconducting electrode layer, or other methods suited to the materials and dimensions of the second superconducting electrode layer. In some embodiments, second superconducting electrode layer formation 512 may include patterning. Afterward, next process 499 may commence.

Although the foregoing examples have been described in some detail to aid understanding, the invention is not limited to the details in the description and drawings. The examples are illustrative, not restrictive. There are many alternative ways of implementing the invention. Various aspects or components of the described embodiments may be used singly or in any combination. The scope is limited only by the claims, which encompass numerous alternatives, modifications, and equivalents.

What is claimed is:

1. A method, comprising:
   forming a first superconducting layer over a substrate;
   forming a dielectric layer over the first superconducting layer;
   forming an opening in the dielectric layer to expose part of a surface of the first superconducting layer;
   sputter-etching the exposed part of the surface of the first superconducting layer;
   forming a non-superconducting layer by atomic layer deposition over the exposed part of the surface of the first superconducting layer; and
   forming a second superconducting layer over the non-superconducting layer;
   wherein the substrate is not subjected to a vacuum break between the sputter-etching and the forming of the non-superconducting layer.

2. The method of claim 1, wherein the sputter-etching comprises at least one of argon or hydrogen.

3. The method of claim 1, further comprising cleaning the exposed part of the surface of the first superconducting layer with an oxidant before the sputter-etching.

4. The method of claim 3, wherein the oxidant comprises one of oxygen or ozone.

5. The method of claim 1, wherein the substrate remains in a single process chamber throughout the sputter-etching and the forming of the non-superconducting layer.

6. The method of claim 1, wherein the sputter-etching is performed in a first process chamber and the forming of the non-superconducting layer is performed in a second process chamber, wherein the first process chamber and the second process chamber share a controlled environment.

7. The method of claim 1, wherein the first superconducting layer or the second superconducting layer comprises at least one of aluminum, niobium, tantalum, titanium, their nitrides, their alloys, a superconducting ceramic, or an organic superconductor.

8. The method of claim 1, wherein a thickness of the first superconducting layer or the second superconducting layer is between about 50 nm and 200 nm.

9. The method of claim 1, wherein an element present in the first superconducting layer is present in the second superconducting layer.

10. The method of claim 1, wherein an element present in the first superconducting layer is present in the non-superconducting layer.

11. The method of claim 1, wherein the dielectric layer comprises silicon oxide.

12. The method of claim 1, wherein a width of the opening is between about 10 nm and 1000 nm.

13. The method of claim 1, wherein the non-superconducting layer comprises an oxide.

14. The method of claim 1, wherein the non-superconducting layer comprises one of silicon oxide, aluminum oxide, germanium oxide, hafnium oxide, niobium oxide, tantalum oxide, titanium oxide, zirconium oxide, or a combination thereof.

15. The method of claim 1, wherein the non-superconducting layer comprises a non-superconducting metal.

16. The method of claim 1, wherein the non-superconducting layer comprises copper, silver, or gold.

17. The method of claim 1, wherein a thickness of the non-superconducting layer is between about 0.5 nm and 3 nm.

18. The method of claim 1, further comprising patterning at least one of the first superconducting layer, the non-superconducting layer, or the second superconducting layer.

19. The method of claim 1, further comprising plasma-treating, UV-irradiating, or annealing the non-superconducting layer.

20. The method of claim 1, wherein the first superconducting layer and the second superconducting layer are operable as electrodes of a Josephson junction; and wherein the non-superconducting layer is operable as the tunnel barrier of a Josephson junction.

* * * * *